United States Patent
Shao et al.

(10) Patent No.: US 11,212,946 B2
(45) Date of Patent: Dec. 28, 2021

(54) PERFORMANCE-PER-WATT OPTIMAL CONTROL LOGIC IN LIQUID COOLING SOLUTION FOR HIGH PERFORMANCE MACHINE-LEARNING COMPUTING

(71) Applicant: Baidu USA LLC, Sunnyvale, CA (US)

(72) Inventors: Shuai Shao, Sunnyvale, CA (US); Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 64 days.

(21) Appl. No.: 16/575,368

(22) Filed: Sep. 18, 2019

(65) Prior Publication Data

US 2021/0084797 A1    Mar. 18, 2021

(51) Int. Cl.
*H05K 7/20* (2006.01)
*G05B 13/04* (2006.01)
*G05B 13/02* (2006.01)

(52) U.S. Cl.
CPC ..... *H05K 7/20836* (2013.01); *G05B 13/0265* (2013.01); *G05B 13/041* (2013.01); *H05K 7/2079* (2013.01)

(58) Field of Classification Search
CPC ..... Y02D 10/00; G06F 1/206; G06F 11/3428; G06F 1/20; G06F 11/3062; G06F 11/0793; H05K 7/20836; H05K 7/20209; G05B 13/024; G05B 2219/2614
See application file for complete search history.

(56) References Cited

U.S. PATENT DOCUMENTS

| | | | |
|---|---|---|---|
| 2003/0115000 A1* | 6/2003 | Bodas | G06F 1/26 702/60 |
| 2008/0026493 A1* | 1/2008 | Shakouri | G06Q 10/04 438/17 |
| 2008/0228462 A1* | 9/2008 | Gross | G06F 11/30 703/22 |
| 2009/0187776 A1* | 7/2009 | Baba | G06F 1/3203 713/320 |
| 2010/0032142 A1* | 2/2010 | Copeland | H05K 7/20836 165/104.33 |

(Continued)

*Primary Examiner* — Darrin D Dunn
(74) *Attorney, Agent, or Firm* — Womble Bond Dickinson (US) LLP

(57) ABSTRACT

An electronic rack includes an array of server blades arranged in a stack. Each server blade contains one or more servers and each server includes one or more processors to provide data processing services. The electronic rack further includes a coolant distribution unit (CDU) and a rack management unit (RMU). The CDU is configured to supply cooling liquid to the processors and to receive the cooling liquid carrying the heat exchanged from the processors. The CDU includes a liquid pump to pump the cooling liquid and a pump controller to control a pump speed of the liquid pump. The RMU is configured to manage the operations of the components within the electronic rack such as CDU, etc. The RMU includes control logic to determine an optimal pump speed of the liquid pump by optimizing an objective function based on processor power consumption of the processors, cooling power consumption of the CDU, and a benchmark performance measurement of the data processing services and to control the pump speed of the liquid pump based on the optimal pump speed.

16 Claims, 7 Drawing Sheets

(56) References Cited

U.S. PATENT DOCUMENTS

| | | | |
|---|---|---|---|
| 2012/0166015 A1* | 6/2012 | Steinbrecher | G06F 1/206 |
| | | | 700/300 |
| 2014/0190681 A1* | 7/2014 | Chainer | H05K 7/20836 |
| | | | 165/289 |
| 2016/0098639 A1* | 4/2016 | Choe | G01R 21/02 |
| | | | 706/12 |
| 2017/0185132 A1* | 6/2017 | Bodas | G06F 11/3433 |
| 2019/0110379 A1* | 4/2019 | Cui | H05K 7/20836 |

* cited by examiner

PERFORMANCE-PER-WATT OPTIMAL CONTROL LOGIC IN LIQUID COOLING SOLUTION FOR HIGH PERFORMANCE MACHINE-LEARNING COMPUTING

FIELD OF THE DISCLOSURE

Embodiments of the present invention relate generally to data centers. More particularly, embodiments of the invention relate to optimal performance control for liquid cooling of electronic racks in data centers.

BACKGROUND

Thermal management of high power density chips and processors are critical problems, especially with the increasing of power density of high end chips, such as CPUs (central processing units) and GPUs (general-purpose processing units). Cooling devices are utilized in cooling system designs are used for maintaining the thermal conditions of the chips by removing the heat generated by the chips. If the temperature exceeds the limitation of the thermal specification, the chips may not function properly and throttling may happen. In addition, by providing proper or better thermal conditions for the chip when it is working, better performance or less power consumption can be achieved.

High performance machine learning computing is enabled by high power density processors, such as data center GPUs. The conventional air-cooling solution is struggling to handle the thermal management challenge in such GPU racks. Instead, cold plate liquid cooling solution provides much better cooling performance and saves energy consumption in cooling infrastructure.

In all previous solutions and reports, the work was focusing on increasing the cooling water temperature and cooling air temperature to improve the power efficiency of the cooling system. However, the interaction between processor's temperature and its power consumption was not included. And the interaction between processor's temperature and its performance was not included. It may not be the optimal control and operation strategy in a data center.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
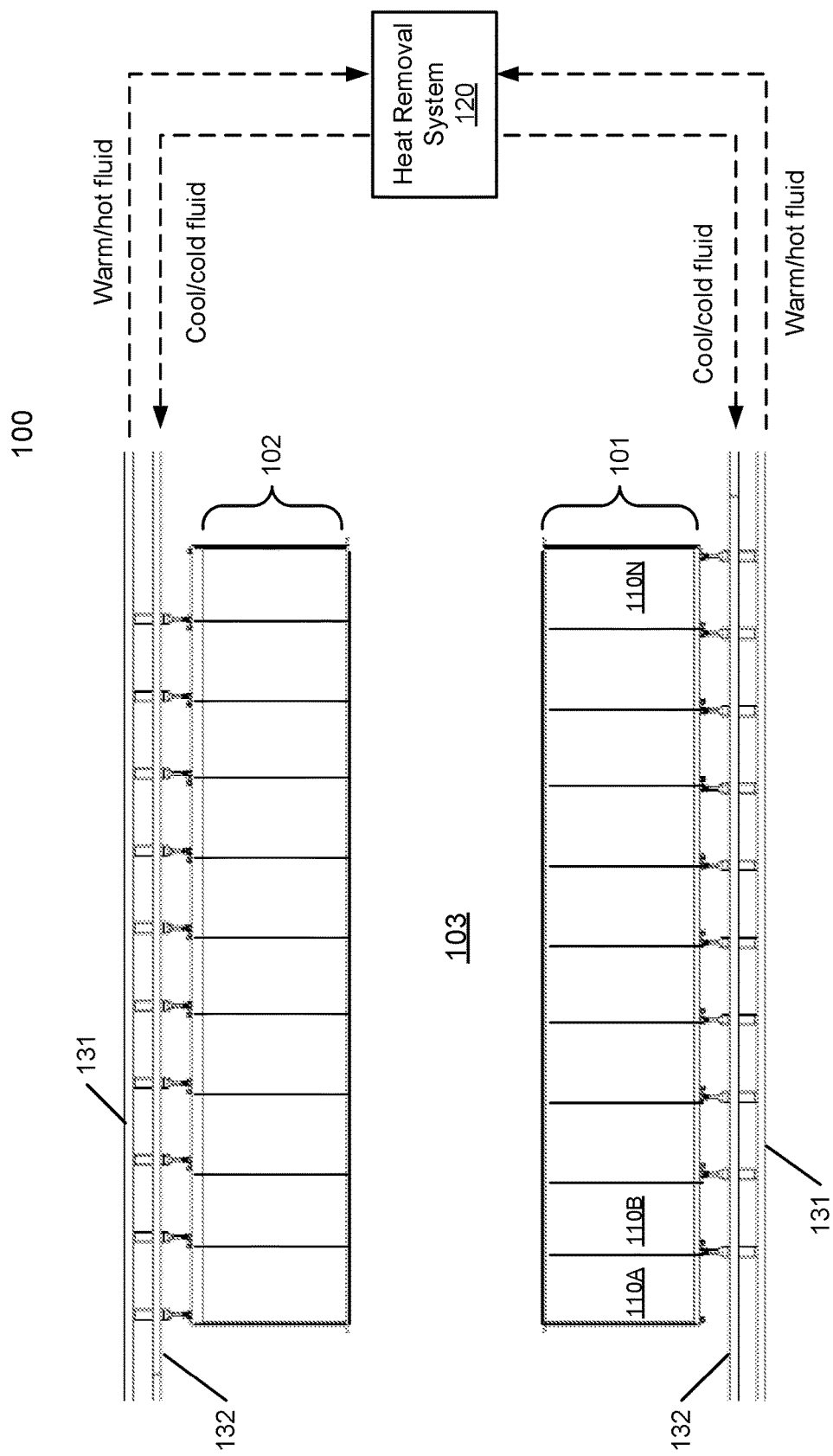
FIG. 1 is a block diagram illustrating an example of a data center system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure focus on how performance-per-watt can be optimized for a liquid-cooled electronic rack. The benchmark training time of the corresponding machine learning model is included as an indicator of the computing performance. The power consumption here consists of the processor power and the cooling power in liquid cooling solution. A higher value of performance-per-watt indicates the systems utilizing electrical power more efficiently. Control logic as a part of rack management unit of an electronic rack is utilized to optimize the performance-per-watt. Machine learning benchmark is utilized to evaluate processor computing performance in particular intended application scenarios. New mathematical models are utilized including the impact of GPU working temperature on the computing performance, the processor power usage, and the cooling power consumption. An optimal processor working temperature is determined accordingly. The entire electronic rack is considered as a whole system. The concept proposed herein is to design and operate the most efficient performance/watt system, especially for the artificial intelligence (AI) machine learning application scenarios, i.e., the servers are specifically configured to perform machine-learning operations of specific types of data or content (e.g., image recognition, object detection, natural language processing or NLP, etc.).

According to one aspect, an electronic rack includes an array of server blades arranged in a stack. Each server blade contains one or more servers and each server includes one or more processors to provide data processing services. The electronic rack further includes a coolant distribution unit (CDU) and a rack management unit (RMU). The CDU is configured to supply cooling liquid to the processors and to receive the cooling liquid carrying the heat exchanged from the processors. The CDU includes a liquid pump to pump the cooling liquid and a pump controller to control a pump speed of the liquid pump. The RMU is configured to manage the operations of the components within the electronic rack such as CDU, etc. The RMU includes control logic to determine an optimal pump speed of the liquid pump by optimizing an objective function based on processor power consumption of the processors, cooling power consumption of the CDU, and a benchmark performance measurement of the data processing services and to control the pump speed of the liquid pump based on the optimal pump speed.

In one embodiment, the objective function is to determine the optimal pump speed such that the objective function reaches the maximum while a set of predetermined constraints is satisfied. The predetermined constraints include a first condition of which a temperature of each processor is within a predetermined temperature range (e.g., between the minimum and maximum temperatures) and a second condition of which a pump speed of the liquid pump is within a predetermined speed range (e.g., between the minimum and maximum speeds).

In one embodiment, the processor power consumption is the sum of the power consumption of all processors within the electronic rack. The power consumption of an individual processor is determined using a first function based on a temperature measured from the processor, such as the temperature of an exterior surface of the processor. The cooling power consumption may be determined using a second function based on a current pump speed of the liquid pump. The temperature of a processor can be determined using a third function based on the power consumption of the processor and the pump speed of the liquid pump. In a particular embodiment, the third function is further based on a liquid temperature of the cooling liquid. The benchmark performance measurement is determined based on a number of data samples and time to process the samples using a predetermined benchmark system corresponding to a type of the data processing services the servers configured to perform.

According to another aspect, a method for determining optimal pump speed of a liquid pump to provide liquid cooling to an electronic rack of a data center is provided. The method includes determining an optimal pump speed of the liquid pump of a CDU of the electronic rack having a number of server blades. Each server blade includes one or more servers and each server includes one or more processors to provide data processing services. Determining the optimal pump speed includes performing optimization of an objective function based on the processor power consumption of the processors, cooling power consumption of the CDU, and a benchmark performance measurement of the data processing services as described above.

FIG. 1 is a block diagram illustrating a data center system according to one embodiment of the invention. In this example, FIG. 1 shows a top view of at least a portion of a data center. Referring to FIG. 1, according to one embodiment, data center system 100 includes rows of electronic racks of IT components, equipment or instruments 101-102, such as, for example, computer servers that provide data services to a variety of clients. In this embodiment, data center system 100 includes electronic racks, such as electronic racks 110A-110N, arranged in row 101 and row 102. However, more or fewer rows of electronic racks may be implemented. Typically, rows 101-102 are aligned in parallel with frontends facing each other and backends facing away from each other, forming aisle 103 in between to allow an administrative person walking therein. However, other configurations or arrangements may also be applied.

In one embodiment, each of the electronic racks (e.g., electronic racks 110A-110N) includes a back panel, a number of server slots, and a number of server blades capable of being inserted into and removed from the server slots. Each server blade includes a processor (e.g., CPU or GPU), a memory, and/or a persistent storage device (e.g., hard disk), which represents a computer server. The back panel is disposed on a backend of the electronic rack. The back panel includes a heat removal liquid manifold assembly to provide heat removal liquid from an external heat removal system 120 to remove heat from the server blades. Each server blade can be inserted and removed from a corresponding server slot from a frontend of the electronic rack. Heat removal system 120 may be a chiller system with an active refrigeration cycle. Alternatively, heat removal system 120 can include but not limited to evaporative cooling, free air, rejection to large thermal mass, and waste heat recovery designs.

In one embodiment, each of the electronic racks in rows 101-102 includes a heat removal liquid manifold, a number of server blades contained in a number of server blade slots respectively, and a coolant distribution unit (CDU). The heat removal liquid manifold is to provide heat removal liquid to each of the server blades. Each of the sever blades is to receive heat removal liquid from the heat removal liquid manifold, to remove at least a portion of the heat generated by an IT component of the server blade using the heat removal liquid manifold, and to transmit warmer liquid carrying the heat exchanged from the IT component back to the heat removal liquid manifold. The CDU is configured to receive data representing a workload of the IT components of the server blades and to control a liquid flow rate of the heat removal liquid supplied to the heat removal liquid manifold based on the workload of the IT components of the server blades.

The heat removal liquid manifold disposed on the backend of each electronic rack is coupled to liquid supply line 132 to receive heat removal liquid from heat removal system 120. The heat removal liquid is to remove heat from the IT component. The resulting warmer or hotter liquid carrying the heat exchanged from the IT component is transmitted via return line 131 back to heat removal system 120. Liquid supply/return lines 131-132 are referred to as data center liquid supply/return lines (e.g., global liquid supply lines), which supply heat removal liquid to all of the electronic racks of rows 101-102.

Figure 2:
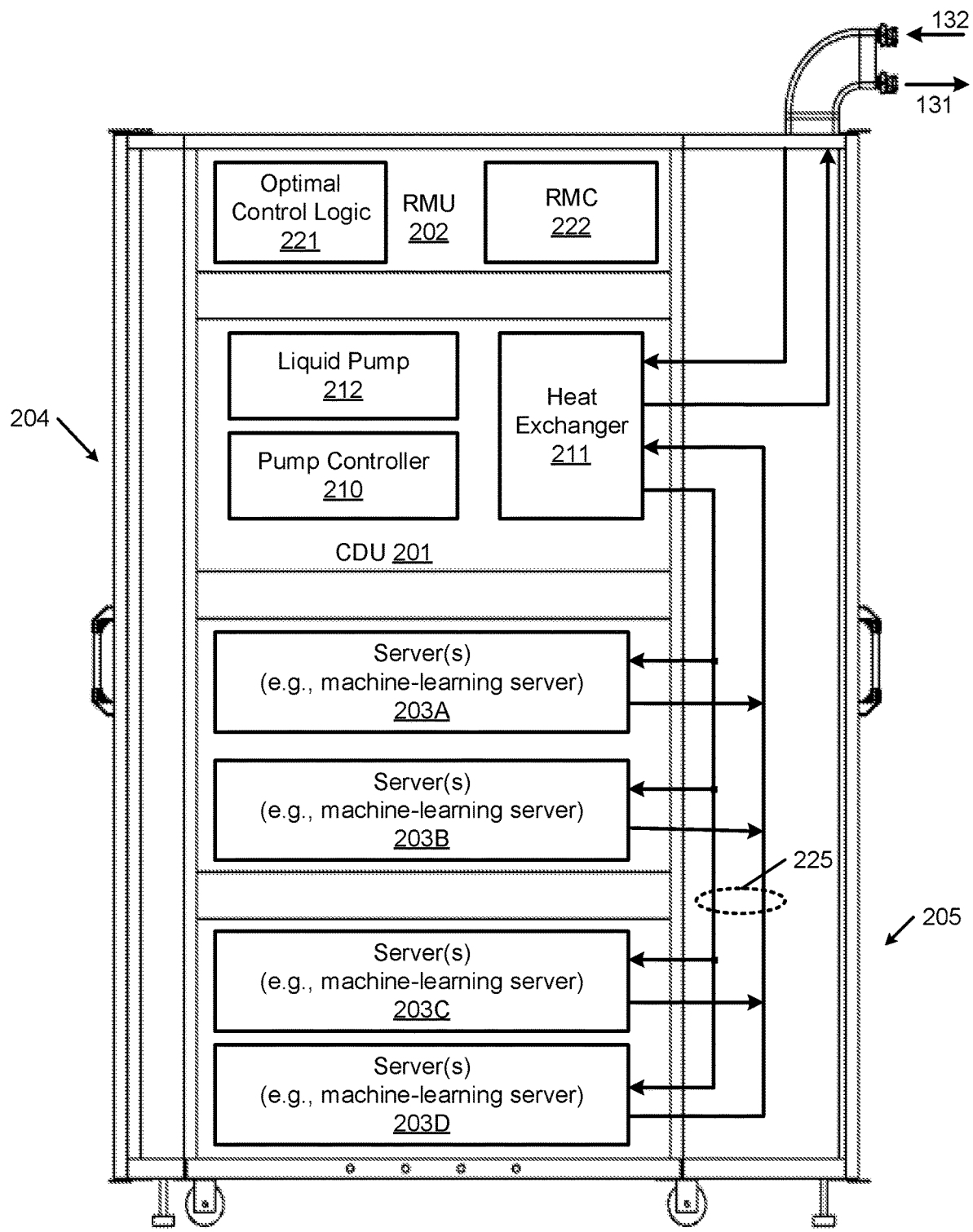
FIG. 2 is a block diagram illustrating an example of an electronic rack according to one embodiment.
Figure 3:
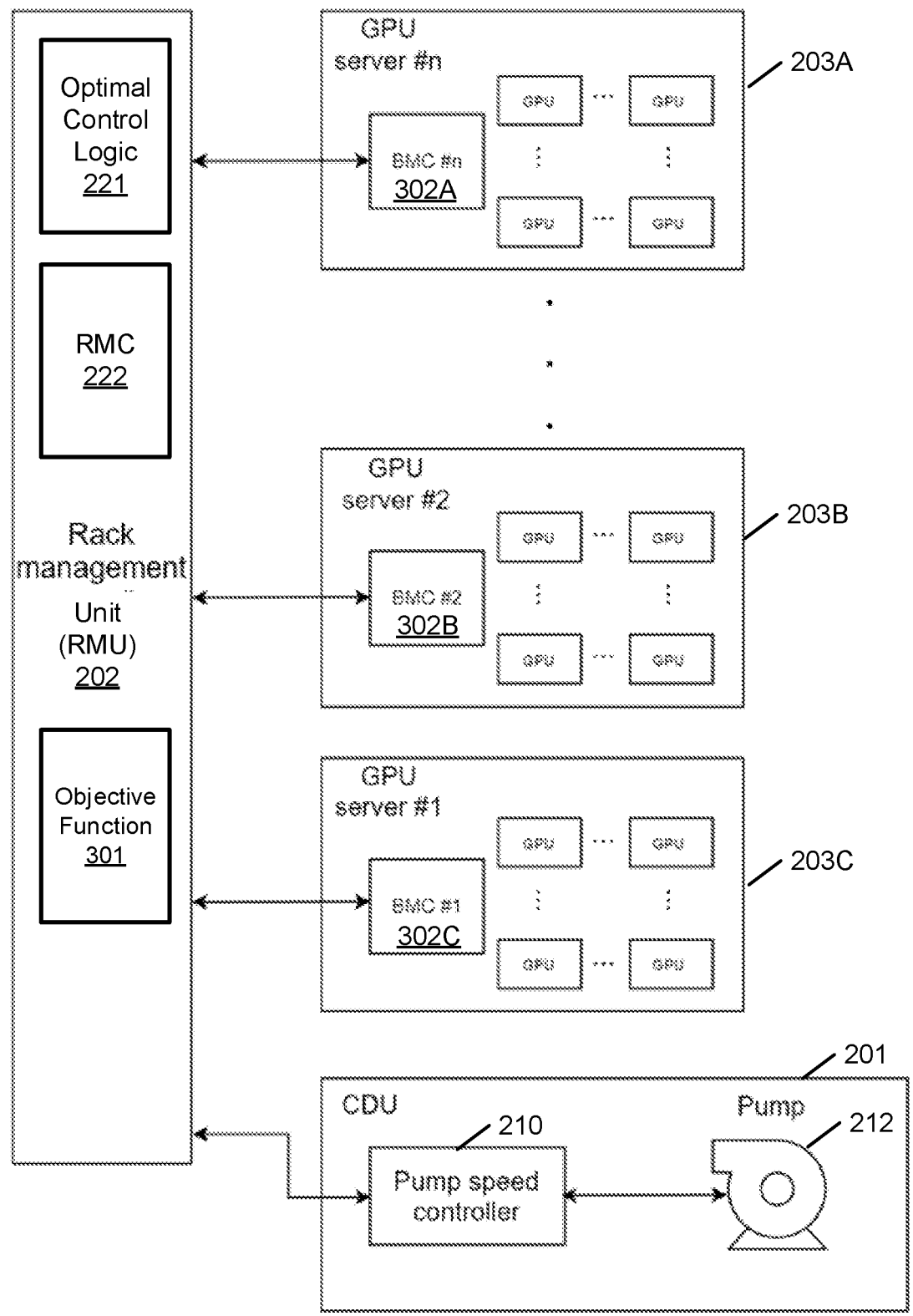
FIG. 3 is a block diagram illustrating an example of an electronic rack according to another embodiment.

FIG. 2 is a block diagram illustrating a side view of an electronic rack according to one embodiment of the invention. Electronic rack 200 may represent any of the electronic racks of rows 101-102 of FIG. 1 such as electronic racks 110A-110N. Referring to FIG. 2, in one embodiment, electronic rack 200 includes CDU 201, RMU 202, and one or more server blades 203A-203D, collectively referred to as server blades 203. Sever blades 203 can be inserted into an array of server slots respectively from frontend 204 of electronic rack 200. Note that although there are only four server blades 203A-203D shown in FIG. 2, more or fewer server blades may be maintained within electronic rack 200. Also note that the particular positions of CDU 201, CMU 202, and server blades 203 are shown for the purpose of illustration only; other arrangements or configurations of CDU 201, CMU 202, and server blades 203 may also be implemented. Further, the front door disposed on frontend 204 and the back door disposed on backend 205 are optional. In some situations, there may no door on frontend 204 and/or backend 205.

In one embodiment, CDU 201 includes heat exchanger 211, liquid pump 212, and pump controller 210. Heat exchanger 211 may be a liquid-to-liquid heat exchanger. Heat exchanger 211 includes a first tube having a first pair of liquid connectors coupled to external liquid supply/return lines 131-132 to form a primary loop, where the connectors coupled to the external liquid supply/return lines 131-132 may be disposed or mounted on backend 205 of electronic rack 200. In addition, heat exchanger 211 further includes a second tube having a second pair of liquid connectors coupled to liquid manifold 225, which may include a supply manifold to supply cooling liquid to server blades 203 and a return manifold to return warmer liquid back to CDU 201. The processors may be mounted on the cold plates, where the cold plates include a liquid distribution channel embedded therein to receive the cooling liquid from the liquid manifold 225 and to return the cooling liquid carrying the heat exchanged from the processors back to the liquid manifold 225.

Each of server blades 203 may include one or more IT components (e.g., CPUs, GPUs, memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which may generate heat during the operations.

Electronic rack 200 further includes RMU 202 configured to provide and manage power supplied to server blades 203 and CDU 201. RMU 202 may be coupled to a power supply unit (not shown) to manage the power consumption of the power supply unit, as well as other thermal management of the power supply unit (e.g., cooling fans). The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimal control logic 221 and rack management controller (RMC) 222. The optimal control logic 221 is coupled to at least some of server blades 203 to receive operating status of each of the server blades 203, such as processor temperatures of the processors, the current pump speed of the liquid pump 212, and liquid temperature of the cooling liquid, etc. Based on this information, optimal control logic 221 determines an optimal pump speed of the liquid pump 212 by optimizing a predetermined objective function, such that the output of the objective function reaches the maximum while a set of predetermined constraints is satisfied. Based on the optimal pump speed, RMC 222 is configured to send a signal to pump controller 210 to control the pump speed of liquid pump 212 based on the optimal pump speed.

FIG. 2 is a block diagram illustrating an example of a simplified electronic rack according to one embodiment. Electronic rack 300 may be implemented as a part of electronic rack 200 as shown in FIG. 2. Referring to FIG. 2, RMU 202 is electrically coupled to servers 203. Specifically, RMU 202 is coupled to a baseboard management controller (BMC) of each of servers 203 (e.g., BMCs 302A-302C, collectively referred to as BMCs 302). A BMC is configured to monitor and collect operating status of each of the components of the corresponding server such as measuring temperatures of the processors using temperature sensors. The processor temperature of a processor may proportionally represent the power consumption of the processor. In one embodiment, RMU 202 further include optimal control logic 221 configured to perform an optimization of objective function 301 based on the data received from servers 203 to determine an optimal pump speed. Based on the optimal pump speed, RMC 222 sends a control signal to pump controller 210 to control the pump speed of liquid pump 212.

In one embodiment, electronic rack 300 includes an array of server blades 203 arranged in a stack. Each server blade contains one or more servers and each server includes one or more processors such as GPUs to provide data processing services. The electronic rack 300 further includes CDU 201 and RMU 202. The CDU 201 is configured to supply cooling liquid to the processors and to receive the cooling liquid carrying the heat exchanged from the processors. The CDU 201 includes a liquid pump 212 to pump the cooling liquid and a pump controller 210 to control a pump speed of the liquid pump. The RMU 202 is configured to manage the operations of the components within the electronic rack such as CDU 201, etc. The RMU 202 includes control logic to determine an optimal pump speed of the liquid pump 212 by optimizing an objective function 301 based on processor power consumption of the processors, cooling power consumption of the CDU 201, and a benchmark performance measurement of the data processing services and to control the pump speed of the liquid pump based on the optimal pump speed.

In one embodiment, the objective function 301 is to determine the optimal pump speed such that the objective function 301 reaches the maximum while a set of predetermined constraints is satisfied. The predetermined constraints include a first condition of which a temperature of each processor is within a predetermined temperature range (e.g., between the minimum and maximum temperatures) and a second condition of which a pump speed of the liquid pump is within a predetermined speed range (e.g., between the minimum and maximum speeds).

In one embodiment, the processor power consumption is the sum of the power consumption of all processors within the electronic rack. The power consumption of an individual processor is determined using a first function based on a temperature measured from the processor, such as the temperature of an exterior surface of the processor. The cooling power consumption may be determined using a second function based on a current pump speed of the liquid pump. The temperature of a processor can be determined using a third function based on the power consumption of the processor and the pump speed of the liquid pump. In a particular embodiment, the third function is further based on a liquid temperature of the cooling liquid. The benchmark performance measurement is determined based on a number of data samples and time to process the samples using a predetermined benchmark system corresponding to a type of the data processing services the servers configured to perform.

In one embodiment, optimal control logic 221 may be implemented in software, hardware, or a combination thereof. For example, optimal control logic 221 may be implemented as a field programmable gate array (FPGA) or an application specific integrated circuit (ASIC). Objective function 301 may be implemented as executable instructions that can be stored in a machine-readable storage medium, such as memory, and executed by optimal control logic 221.

In one embodiment, the objective function represents the performance-per-watt η. The goal is to maximize the performance-per-watt η while a set of predetermined constraints is satisfied. In one embodiment, the performance-per-watt can be calculated based on the following equation:

$$\eta = \frac{\text{Performance}}{\text{Power}} = \frac{N/t_{training}}{P_{GPU,total} + P_{cooling}}. \tag{1}$$

N is the total number of samples in a dataset or in a certain job, $t_{training}$ is the amount of time required to train a model on the specific dataset or on the job so that the model prediction reaches the quality target. The N and $t_{training}$ are determined by a predetermined benchmark training system performed on the corresponding types of data (e.g., image recognition machine-learning model training) that the servers intend or are configured to perform. Thus $$\frac{N}{t_{training}}$$

indicates how many samples are processed per unit of time. Higher ratio value means the system process the samples faster for training. In the machine learning community, there are specific benchmarks for different application scenarios to evaluate the computing system's performance. Each benchmark is considered as the representative of the tasks from a certain application scenario. One example of the benchmarks is listed below. Total sample number N is defined by the dataset, where ImageNet includes a total of N=1,281,167 images for training. The training time is defined by running the benchmark.

For example, following table shows the data of image classification scenario.

| Application Scenario | Dataset | Quality Target | Reference Implementation Model |
|---|---|---|---|
| Image classification | ImageNet | 75.9% Top-1 Accuracy | Resnet-50 v1.5 |

For the purpose of illustration, a GPU is utilized as an example of a processor. The test results show that GPU computing performance is related to the GPU case temperature $T_{case}$. As $T_{case}$ decreases, the training time $t_{training}$ is reduced. By generating a plot or graph of $t_{training}$ versus $T_{case}$, and performing a m-order polynomial curve fitting, the mathematical model of GPU training time $t_{training}$ is formulated in terms of $T_{case}$ as below.

$$t_{training}(T_{case}) = c_m T_{case}^m + c_{m-1} T_{case}^{m-1} + \ldots + c_1 T_{case} + c_0 \quad (2)$$

Figure 4:
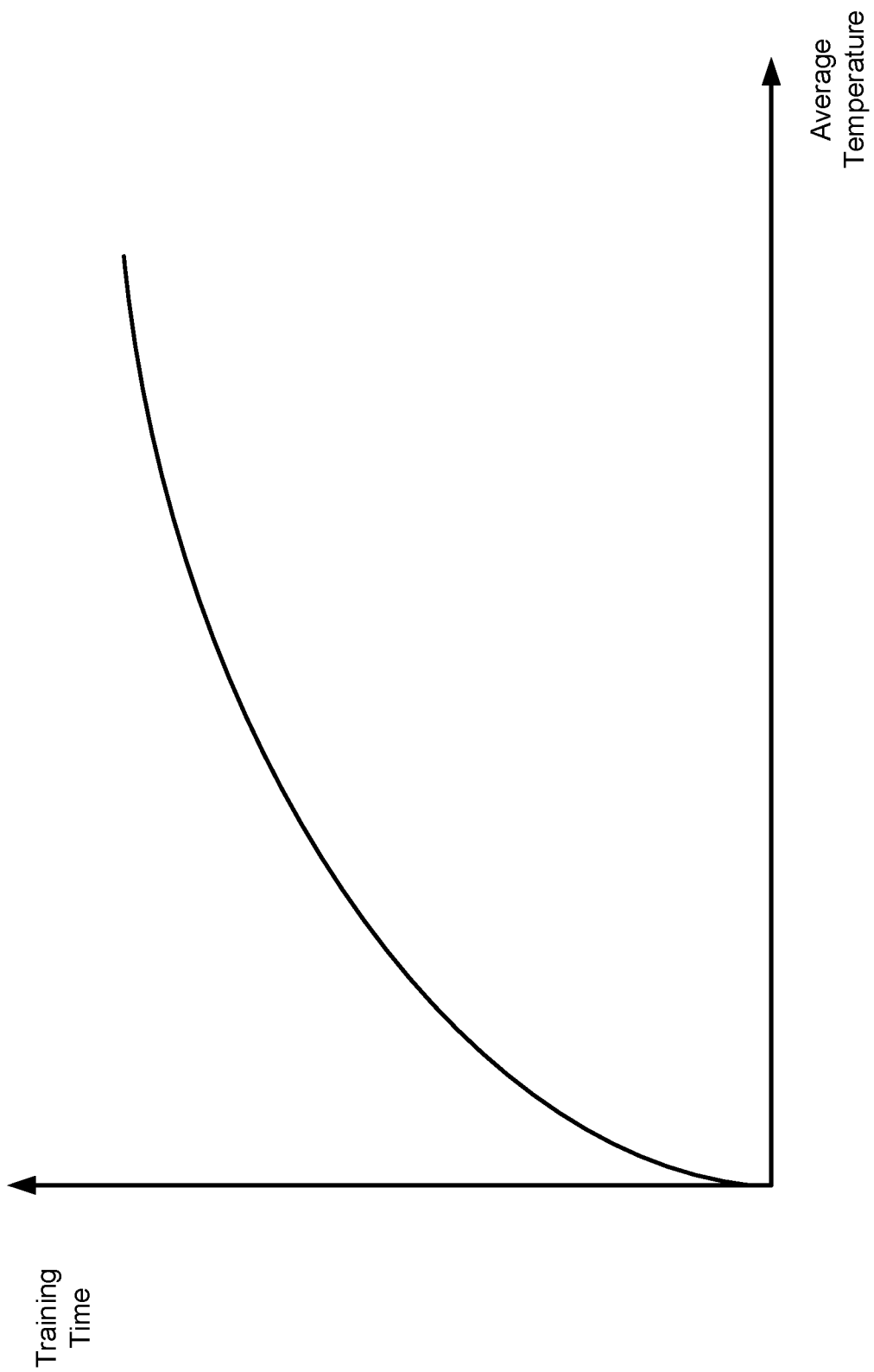
FIG. 4 is a diagram illustrating an example of a polynomial curve between a processor temperature and a benchmark training time according to one embodiment.

The polynomial curve can be obtained based on a large amount of data processed by the benchmark system corresponding to the same or similar type of data processing services (e.g., image recognition, object detection, NLP) during the training of machine-learning models. An example of such a polynomial curve is shown in FIG. 4. The training time can be determined by performing a lookup operation on the curve based on the average processor temperature measure at the point in time.

$P_{GPU,total}$ is the power consumption of all the GPUs, which is proportionally related to the processor temperature. As $T_{case}$ decreases, where $T_{case}$ represents the temperature of the processor case or exterior surface, GPU consumes less power when performing the same task. It is because the leakage power (due to current leakage) in processors' IC circuits becomes lower.

$$P_{GPU}(T_{case}) = P_{leakge} + P_{other} = a_1 T_{case}^2 \exp\left(-\frac{a_2}{T_{case}}\right) + a_3. \quad (3)$$

Coefficients $a_1$, $a_2$ and $a_3$ are constant since they are independent with the case temperature. These coefficients are related to the type of the processors and/or the voltage requirement of the processors.

$P_{cooling}$ is the power consumption of the pump in the CDU. The mathematical model of $P_{cooling}$ in terms of pump speed $v_{pump}$ is defined as follows:

$$P_{cooling} = P_{pump} = b v_{pump}^3, \quad (4)$$

where constant b is related to the type or manufacturer of the liquid pump.

The optimization design according to one embodiment consists of:

Control variable: Pump speed $v_{pump}$;
Design constraints: Pump speed range ($v_{pump,min}$, $v_{pump,max}$), GPU Tcase<Tmax;
Design objective: To maximize the performance per watt represented by Equation (1). It is represented by a mathematical function in terms of the control variable, namely the objective function. Specifically, a certain value of pump speed determines the maximized value of performance per watt.

The next step is to formulate the objective function in terms of the control variable. GPU is cooled by liquid flow. The liquid goes through the cold plate while carrying away the heat that is generated by the GPU. There are multiple GPUs in a GPU server. They could have different case temperatures. Assuming the total amount of GPUs per rack is n, we define a vector of GPU case temperatures in an IT rack as, $$\vec{T}_{case} = \begin{pmatrix} T_{case,1} \\ T_{case,2} \\ \ldots \\ T_{case,n} \end{pmatrix}.$$

We take the average of the GPU case temperatures, which is expressed as follows:

$$\overline{T}_{case} = \frac{\sum_{i=1}^{n} T_{case,i}}{n} = \text{mean}(\vec{T}_{case}).$$

Regarding cooling power consumption, it is the function of pump speed as follows:

$$P_{cooling} = P_{pump} = f_1(v_{pump}). \quad (5)$$

Function $f_1(\ )$ may be represented by Equation (4). The GPU power consumption is considered as the function of GPU case temperature:

$$P_{GPU,i} = f_2(T_{case,i}). \quad (6)$$

Function $f_2(\ )$ may be represented by Equation (3). The GPU power consumption in the IT rack is the total of all GPUs' power, namely $P_{GPU,total}$, which is expressed as $$P_{GPU,total} = \sum_{i=1}^{n} P_{GPU,i} = \sum_{i=1}^{n} f_2(T_{case,i}) = f_3(\vec{T}_{case}). \quad (7)$$

Function $f_3(\ )$ represents the sum of processor power consumption of all processors. Regarding performance, the whole task is distributed across all the GPUs in the rack. Every GPU contributes to one part of the task. So we treat the GPU rack as a whole, and use the average GPU case temperature $T_{csae}$, to formulate the expression of the training time.

$$t_{training} = f_4(\vec{T}_{case}). \tag{8}$$

In one embodiment, function $f_4(\ )$ can be represented by a polynomial curve as shown in FIG. 4, which may be implemented as a lookup table. The training time $t_{training}$ can be obtained by performing a lookup operation based on the average processor temperature.

The relation between the case temperatures $\vec{T}_{case}$ and the pump speed $v_{pump}$ are established as follows:

$$\vec{T}_{case,i} = \vec{f}_5(v_{pump}, P_{GPU,i}), i=1,2,\ldots n. \tag{9}$$

Figure 5A:
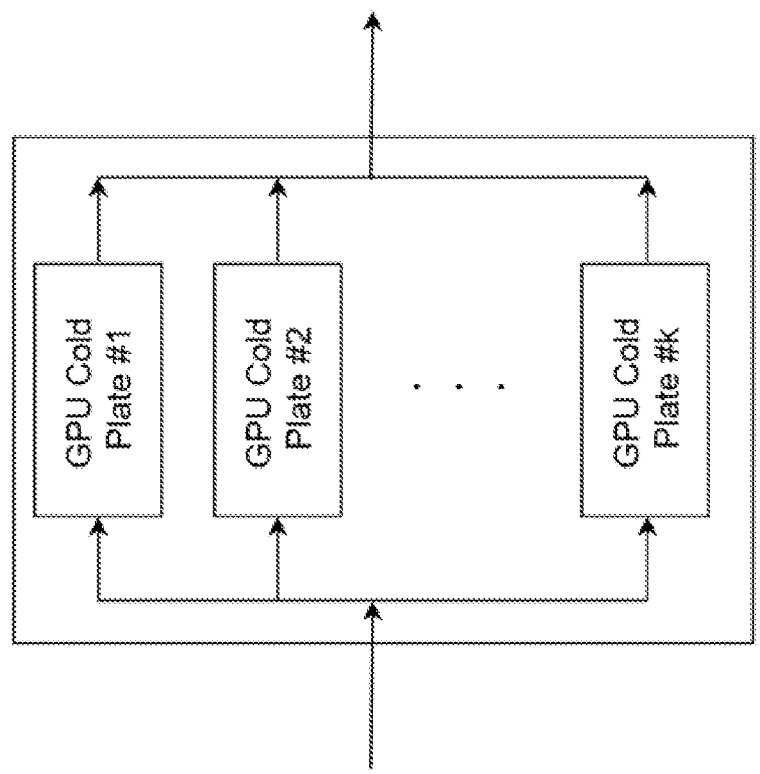
FIGS. 5A and 5B show different processors configurations according to certain embodiments.

Function $f_5(\ )$ represents the case temperature of a particular processor. In one embodiment, when all of the processors are connected in parallel as shown in FIG. 5A, the temperature of an individual processor (i) (which is represented by function $f_5(\ )$) can be obtained as follows:

$$T_{case,i} = P_{GPU,i} C_1 v_{pump}^{-0.8} + T_{liquid}$$

where $T_{liquid}$ represents the temperature of the cooling liquid at the point in time.

Figure 5B:
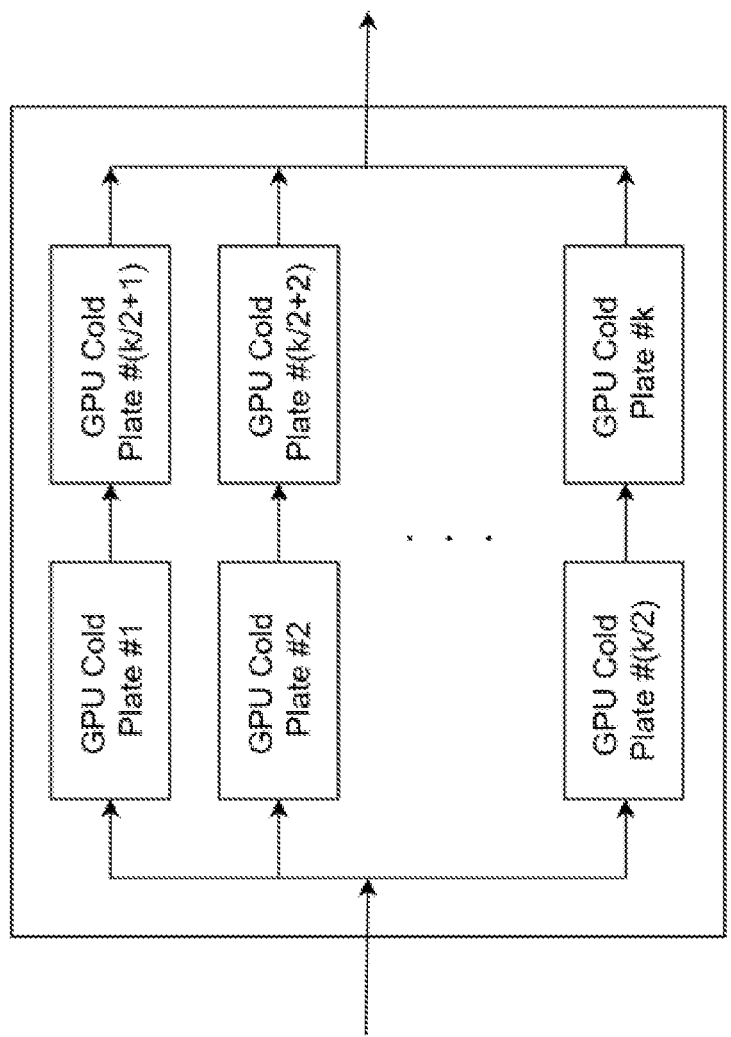

In a more complicated scenario where both series connection and parallel connection are in the server as shown in FIG. 5B, there is variation of the governing equations. For a processor located upstream of cold plates (e.g., cold plates #1 to #(k/2)), the temperature of the processor (u) can be determined as follows:

$$T_{case,u} = P_{GPU,u} C_1 v_{pump}^{-0.8} + T_{liquid}$$

For a processor located downstream of the cold plates (e.g., cold plates #(k/2+1) to #k), the temperature of the processor can be determined as follows:

$$T_{case,d} = P_{GPU,d} C_1 v_{pump}^{-0.8} + T_{liquid} + \frac{P_{GPU,u}}{C_2 v_{pump}}$$

Both Equation (6) and Equation (9) contain $P_{GPU,i}$. Plugging Equation (6) into Equation (9) will solve the unknown $T_{case,i}$ in terms of $v_{pump}$, namely, $$\vec{T}_{case} = \vec{f}_6(v_{pump}). \tag{10}$$

Substituting Equation (10) into Equation (7), the expressions of total GPU power consumption, and into Equation (8), the training time, lead to mathematical models in terms of the control variable as, $$P_{GPU,total} = f_3[\vec{f}_6(v_{pump})], \tag{11}$$

$$t_{training} = f_4[\text{mean}(\vec{f}_6(v_{pump}))], \tag{12}$$

Therefore, the mathematical model or objective function of the performance per watt in terms of pump speed is developed as, $$\eta(v_{pump}) = \frac{\text{Performance}}{\text{Power}} = \frac{\frac{N}{t_{training}}}{P_{GPU,total} + P_{cooling}} = \tag{13}$$

$$\frac{N}{f_4[\text{mean}(\vec{f}_6(v_{pump}))]} \times \frac{1}{f_3[\vec{f}_6(v_{pump})] + f_1(v_{pump})}.$$

In summary, the optimization model is presented as below, in terms of the control variable, $$x = v_{pump},$$

maximize the objective function $f_{obj} = \eta(x)$, subject to the constraint function $\vec{g}(x) \leq \vec{0}$, which is $$\vec{g}(x) = \begin{pmatrix} g_1(x) \\ g_2(x) \\ \ldots \\ g_n(x) \\ g_{n+1}(x) \\ g_{n+2}(x) \end{pmatrix} = \begin{pmatrix} T_{case,1} - T_{max} \\ T_{case,2} - T_{max} \\ \ldots \\ T_{case,n} - T_{max} \\ v_{pump,min} - v_{pump} \\ v_{pump} - v_{pump,max} \end{pmatrix} = \begin{pmatrix} \vec{f}_6(v_{pump}) - \vec{T}_{max} \\ v_{pump,min} - v_{pump} \\ v_{pump} - v_{pump,max} \end{pmatrix} \leq \vec{0}$$

As shown above, the set of constraints includes a condition of which each processor temperature is less than a maximum temperature $T_{max}$. The set of constraints further includes a condition of which the pump speed of the liquid pump is within a predetermined range $[v_{pump,min}, v_{pump,max}]$.

Within the bounded range of x, there is always an optimal point x* that lets $\eta(x^*)$ reach the maximum value. The optimization design proposed may be applied to a GPU pod consisting of multiple IT racks. The GPU pod is supported by a CDU which has a higher pumping capacity and a higher cooling capacity. The concept can be used in designing and operating air cooling system. To adjust the cooling infrastructure and cooling conditions to achieve the best performance/watt, as well as dollar/watt. The performance can be defined in other similar fashions, such as sample numbers per Joule.

Figure 6:
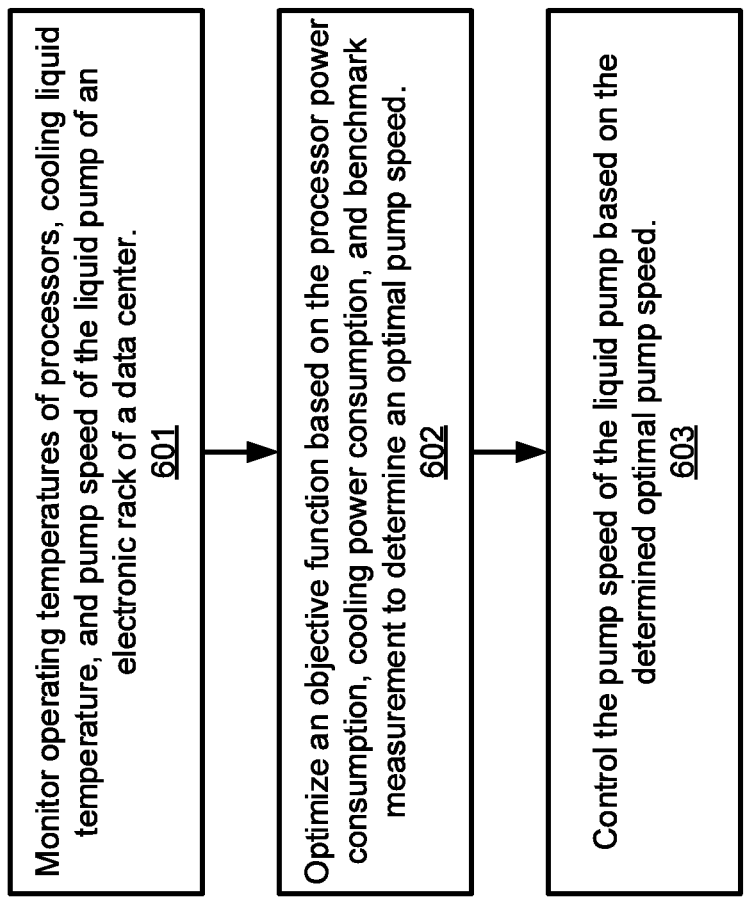
FIG. 6 is a flow diagram illustrating a process of determining an optimal pump speed of a liquid pump according to one embodiment.

FIG. 6 is a flow diagram illustrating an example of a process for determining an optimal pump speed of a liquid pump according to one embodiment. Process 600 may be performed by processing logic which may include software, hardware, or a combination thereof. For example, process 600 may be performed by RMU 202 of FIG. 2. Referring to FIG. 6, at block 601, processing logic monitors the temperatures of the processors, the temperature of the cooling liquid, and the speed of the liquid pump using a variety of sensors. At block 602, processing logic perform an optimization of an objective function based on the processor power consumption, cooling power consumption, and benchmark performance measurement to determine an optimal pump speed. As described above, the processor power consumption can be represented by the processor temperatures. The cooling power consumption can be represented by the pump speed. The optimization is to maximize the objective function while a predetermined set of constraints is satisfied. At block 603, processing logic is to control the pump speed of the liquid pump based on the optimal pump speed.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack of a data center, comprising:
   a plurality of server blades arranged in a stack, each server blades containing one or more servers and each server including one or more processors to provide data processing services;
   a coolant distribution unit (CDU) to supply cooling liquid to the processors and to receive the cooling liquid carrying heat exchanged from the processors, wherein the CDU includes a liquid pump to pump the cooling liquid and a pump controller to control a pump speed of the liquid pump; and
   a rack management unit (RMU) coupled to the server blades and the CDU, wherein the RMU includes control logic configured to
      determine an optimal pump speed of the liquid pump by optimizing an objective function based on processor power consumption of the processors, cooling power consumption of the CDU, and a benchmark performance measurement of the data processing services, wherein the benchmark performance measurement is determined based on a number of data samples and time to process the samples using a predetermined benchmark system corresponding to a type of the data processing services that the one or more servers are configured to perform, wherein each processor power consumption of each processor is determined based on a temperature of an exterior surface of each processor, and
      control the pump speed of the liquid pump via the pump controller based on the optimal pump speed.

2. The electronic rack of claim 1, wherein optimizing the objective function comprises determining the optimal pump speed such that the objective function reaches a maximum value, while a set of predetermined constraints is satisfied.

3. The electronic rack of claim 2, wherein the predetermined constraints comprise:
   a first condition that the temperature of each processor is within a predetermined temperature range; and
   a second condition that the pump speed of the liquid pump is within a predetermined speed range.

4. The electronic rack of claim 2, wherein the processor power consumption of the processors represents a sum of power consumption of each of the processors.

5. The electronic rack of claim 4, wherein the cooling power consumption is determined using a second function based on the pump speed of the liquid pump.

6. The electronic rack of claim 5, wherein the temperature of each processor is determined using a third function based on the power consumption of the processor and the pump speed of the liquid pump.

7. The electronic rack of claim 6, wherein the third function is further based on a liquid temperature of the cooling liquid.

8. A method for determining an optimal pump speed of a liquid pump to provide liquid cooling to an electronic rack of a data center, the method comprising:
   determining an optimal pump speed of the liquid pump of a coolant distribution unit (CDU) of the electronic rack having a plurality of server blades, each server blade including one or more servers and each server including one or more processors to provide data processing services, wherein the CDU is configured to provide cooling liquid to the processors, the CDU including a pump controller to control a pump speed of the liquid pump, wherein determining the optimal pump speed comprises
      optimizing an objective function based on processor power consumption of the processors, cooling power consumption of the CDU, and a benchmark performance measurement of the data processing services, wherein the benchmark performance measurement is determined based on a number of data samples and time to process the samples using a predetermined benchmark system corresponding to a type of the data processing services that the one or more servers are configured to perform, wherein each processor power consumption of each processor is determined based on a temperature of an exterior surface of each processor; and
   controlling the pump speed of the liquid pump via the pump controller based on the optimal pump speed.

9. The method of claim 8, wherein optimizing the objective function comprises determining the optimal pump speed such that the objective function reaches a maximum value, while a set of predetermined constraints is satisfied.

10. The method of claim 9, wherein the predetermined constraints comprise:
    a first condition that a temperature of each processor is within a predetermined temperature range; and
    a second condition that a pump speed of the liquid pump is within a predetermined speed range.

11. The method of claim 9, wherein optimizing the objective function further comprises determining the processor power consumption of the processors based on a sum of power consumption of each of the processors.

12. The method of claim 11, wherein optimizing the objective function further comprises determining the cooling power consumption using a second function based on the pump speed of the liquid pump.

13. The method of claim 12, wherein optimizing the objective function further comprises determining the temperature of each processor using a third function based on the power consumption of the processor and the pump speed of the liquid pump.

14. The method of claim 13, wherein the third function is further based on a liquid temperature of the cooling liquid.

15. A non-transitory machine-readable medium having instructions stored therein, which when executed by a processor, cause the processor to perform operations of determining optimal pump speed of a liquid pump providing liquid cooling to an electronic rack of a data center, the operations comprising:
    determining an optimal pump speed of the liquid pump of a coolant distribution unit (CDU) of the electronic rack having a plurality of server blades, each server blade including one or more servers and each server including one or more processors to provide data processing services, wherein the CDU is configured to provide cooling liquid to the processors, the CDU including a pump controller to control a pump speed of the liquid pump, wherein determining the optimal pump speed comprises
       optimizing an objective function based on processor power consumption of the processors, cooling power consumption of the CDU, and a benchmark performance measurement of the data processing services, wherein the benchmark performance measurement is determined based on a number of data samples and time to process the samples using a predetermined benchmark system corresponding to a type of the data processing services that the one or more servers are configured to perform, wherein each processor power consumption of each processor is determined based on a temperature of an exterior surface of each processor; and controlling the pump speed of the liquid pump via the pump controller based on the optimal pump speed.

16. The machine-readable medium of claim 15, wherein optimizing the objective function comprises determining the optimal pump speed such that the objective function reaches a maximum value, while a set of predetermined constraints is satisfied.

* * * * *